United States Patent
Wang

(10) Patent No.: US 8,903,322 B2
(45) Date of Patent: Dec. 2, 2014

(54) WIRELESS COMMUNICATION DEVICE HAVING STABLE CALLING QUALITY

(71) Applicant: Xiao-Dong Wang, Shenzhen (CN)

(72) Inventor: Xiao-Dong Wang, Shenzhen (CN)

(73) Assignees: Shenzhen Futaihong Precision Industry Co., Ltd., Shenzhen (CN); Chi Mei Communication Systems, Inc., New Taipei (TW)

( * ) Notice: Subject to any disclaimer, the term of this patent is extended or adjusted under 35 U.S.C. 154(b) by 228 days.

(21) Appl. No.: 13/681,382

(22) Filed: Nov. 19, 2012

(65) Prior Publication Data
US 2013/0344914 A1 Dec. 26, 2013

(30) Foreign Application Priority Data
Jun. 21, 2012 (CN) .......................... 2012 1 0206654

(51) Int. Cl.
| | |
|---|---|
| H04B 1/00 | (2006.01) |
| H04W 88/02 | (2009.01) |
| H04B 1/04 | (2006.01) |
| H04W 52/02 | (2009.01) |

(52) U.S. Cl.
CPC ............. *H04W 88/02* (2013.01); *H04B 1/0475* (2013.01); *H04W 52/0251* (2013.01); *H04B 2001/045* (2013.01)
USPC .......................... 455/63.1; 455/67.13; 455/75

(58) Field of Classification Search
USPC ......................................... 455/63.1, 67.13, 75
See application file for complete search history.

(56) References Cited

U.S. PATENT DOCUMENTS

2014/0155000 A1* 6/2014 Erkens ............................ 455/73

* cited by examiner

*Primary Examiner* — Raymond Dean
(74) *Attorney, Agent, or Firm* — Novak Druce Connolly Bove + Quigg LLP

(57) ABSTRACT

A wireless communication device includes a central processing unit (CPU), a sensor electrically connected to the CPU, an antenna module, and a matching circuit electrically connected between the CPU and the antenna module. In response to a call being made by the wireless communication device and in response to detection of an external object within a predetermined range of the wireless communication device by the sensor, the sensor transmits a signal to trigger the CPU to generate a control signal. The matching circuit receives the signal from the CPU and shifts the resonant frequency of the antenna module down.

14 Claims, 1 Drawing Sheet

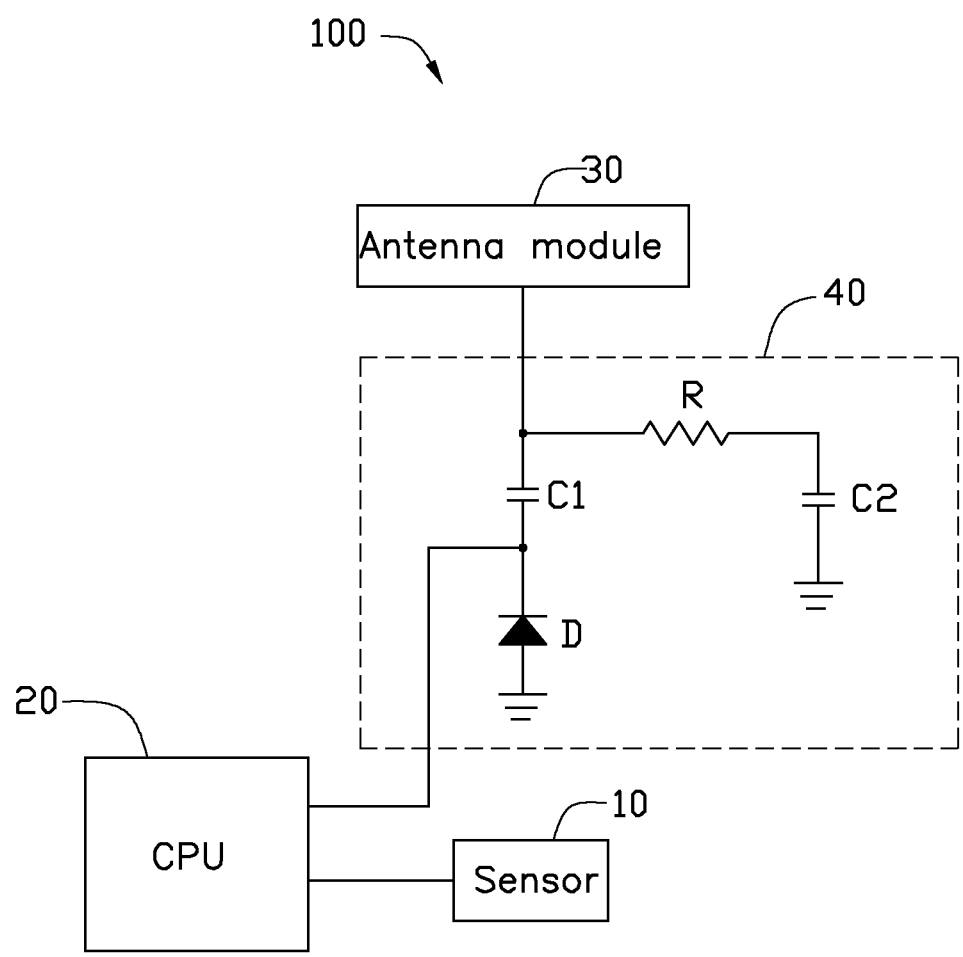

WIRELESS COMMUNICATION DEVICE HAVING STABLE CALLING QUALITY

BACKGROUND

1. Technical Field

The disclosure generally relates to wireless communication devices, and particularly to a wireless communication device having a stable calling quality.

2. Description of Related Art

When wireless communication devices such as mobile phones are used to make a call, hands and a head of a user are relatively close to or even in contact with the wireless communication device and generate interference with an antenna of the wireless communication device. A resonant frequency of the antenna may be shifted to a high frequency due to the interference so that the performance of the antenna in receiving or transmitting signals is reduced and a calling quality of the wireless communication device may be negatively influenced as a result.

Therefore, there is room for improvement within the art.

BRIEF DESCRIPTION OF THE DRAWING

Many aspects of the present disclosure can be better understood with reference to the following drawing. The components in the drawing are not necessarily drawn to scale, the emphasis instead being placed upon clearly illustrating the principles of the disclosure.

The FIGURE is a partial circuit diagram of a wireless communication device, according to an exemplary embodiment of the disclosure.

DETAILED DESCRIPTION

The FIGURE shows a partial circuit diagram of a wireless communication device 100, according to an exemplary embodiment of the disclosure. The wireless communication device includes a sensor 10, a central processing unit (CPU) 20, an antenna module 30 and a matching circuit 40. The sensor 10 is electrically connected to the CPU 20. The antenna module 30 is electrically connected to the CPU 20 by the matching circuit 40.

The sensor 10 is positioned in the wireless communication device 100. In an exemplary embodiment, the sensor 10 is positioned in the wireless communication device 100 adjacent to a loudspeaker of the wireless communication device 100. The sensor 10 detects whether an external object is within a predetermined range of the wireless communication device 100 (e.g. whether hands or a head of a user is close to or in contact with the wireless communication device 100) when the wireless communication device 100 is being used to make a call. The sensor 10 transmits a signal to the CPU 20 when the external object is detected within a predetermined range of the sensor 10.

In a first exemplary embodiment, the sensor 10 may be a light sensor. The light sensor determines whether the external object is close (e.g., within 5 cm) to the wireless communication device 100 according intensity of light around the light sensor. For example, when the external object is close to the wireless communication device 100, the light intensity around the light sensor is less than when no object is close to the wireless communication device 100.

In a second exemplary embodiment, the sensor 10 may be a proximity sensor. The proximity sensor sends a signal to the CPU 10 when an external object is close to the wireless communication device 100 within the predetermined range.

The CPU 20 receives the signal from the sensor 10 and transmits a control signal to the matching circuit 40. The CPU 20 controls the matching circuit 40 to adjust a resonant frequency of the antenna module 30. Commonly, the CPU 20 also turns off a screen of the wireless communication device 100 to save power.

The antenna module 30 receives and transmits wireless communication signals. The antenna module 30 may be or include a monopole antenna.

The matching circuit 40 includes a variable capacitance diode D, a first capacitor C1, a resistor R and a second capacitor C2.

A cathode of the variable capacitance diode D is electrically connected to the antenna module 30 by the first capacitor C1 and also electrically connected to the CPU 20. An anode of the variable capacitance diode D is grounded. The resistor R and the second capacitor C2 are connected in series. A first end of the resistor R and of the second capacitor C2 is electrically connected to the cathode of the variable capacitance diode D. A second end of the resistor R and of the second capacitor C2 are grounded. When the control signal is transmitted from the CPU 20 to the variable capacitance diode D, the capacitance of the variable capacitance diode D is changed to make the resonant frequency of the antenna module 30 shift toward a low frequency and stabilize the resonant frequency of the antenna module 30.

When the wireless communication 100 is being used to make a call, the sensor 10 detects the head or the hands of the user is close to or in contact with the wireless communication device 100, and sends a signal to the CPU 20. The CPU 20 receives the signal and transmits a control signal to the matching circuit 40 to adjust the capacitance of the variable capacitance diode D so that the resonant frequency of the antenna module 30 is shifted toward a lower frequency (e.g., 10 Hz).

The downward shift in frequency reduces or even eliminates any frequency shift, or tendency to shift, to a higher frequency because of interference caused by the hands or head of the user, and ensures a better calling quality.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A wireless communication device, comprising:
 a central processing unit (CPU);
 a sensor electrically connected to the CPU, and in response to a call being made by the wireless communication device and in response to detection of an external object within a predetermined range of the wireless communication device by the sensor, the sensor transmits a signal to trigger the CPU to generate a control signal;
 an antenna module; and
 a matching circuit electrically connected between the CPU and the antenna module, the matching circuit receiving the control signal from the CPU and controlling a resonant frequency of the antenna module to shift towards a lower frequency.

2. The wireless communication device of claim 1, wherein the matching circuit comprises a variable capacitance diode; a cathode of the variable capacitance diode is electrically connected to the antenna module and the CPU, an anode of the variable capacitance diode is grounded; the resonant frequency of the antenna module to shifted by changing an equivalent capacitance of the variable capacitance diode by the control signal.

3. The wireless communication device of claim 2, wherein the matching circuit further comprises a first capacitor; the cathode of the variable capacitance diode is electrically connected to the antenna module by the first capacitor.

4. The wireless communication device of claim 3, wherein the matching circuit further comprises a resistor and a second capacitor electrically connected in series; a first end of the resistor and the second capacitor is electrically connected to the cathode of the variable capacitance diode, and a second end of the resistor and the second capacitor is grounded.

5. The wireless communication device of claim 1, wherein the sensor determines whether the wireless communication device is making a call and whether the external object is within the predetermined range of the wireless communication device by detecting whether the external object is close to or in contact with the wireless communication device.

6. The wireless communication device of claim 5, wherein the sensor is a light sensor.

7. The wireless communication device of claim 5, wherein the sensor is a proximity sensor.

8. A wireless communication device, comprising:
a central processing unit (CPU);
a sensor electrically connected to the CPU, and in response to a call being made by the wireless communication device and in response to detection of an external object within a predetermined range of the wireless communication device by the sensor, the sensor transmits a signal to the CPU;
an antenna module; and
a matching circuit electrically connected between the CPU and the antenna module; the CPU receives the signal from the sensor and adjusting an equivalent capacitance of the matching circuit to stabilize a resonant frequency of the antenna module.

9. The wireless communication device of claim 8, wherein the matching circuit comprises a variable capacitance diode; a cathode of the variable capacitance diode is electrically connected to the antenna module and the CPU, an anode of the variable capacitance diode is grounded; the resonant frequency of the antenna module is stabilized by changing the equivalent capacitance of the variable capacitance diode.

10. The wireless communication device of claim 9, wherein the matching circuit further comprises a first capacitor; the cathode of the variable capacitance diode is electrically connected to the antenna module by the first capacitor.

11. The wireless communication device of claim 10, wherein the matching circuit further comprises a resistor and a second capacitor electrically connected in series; a first end of the resistor and the second capacitor is electrically connected to the cathode of the variable capacitance diode, and a second end of the resistor and the second capacitor is grounded.

12. The wireless communication device of claim 8, wherein the sensor determines whether the wireless communication device is making a call and whether the external object is within the predetermined range of the wireless communication device by detecting whether the external object is close to or in contact with the wireless communication device.

13. The wireless communication device of claim 12, wherein the sensor is a light sensor.

14. The wireless communication device of claim 12, wherein the sensor is a proximity sensor.

* * * * *